United States Patent [19]
Russell et al.

[11] Patent Number: 5,840,592
[45] Date of Patent: Nov. 24, 1998

[54] METHOD OF IMPROVING THE SPECTRAL RESPONSE AND DARK CURRENT CHARACTERISTICS OF AN IMAGE GATHERING DETECTOR

[75] Inventors: Stephen D. Russell, San Diego, Calif.; Douglas A. Sexton, Adair Village, Oreg.; Eugene P. Kelley, Spring Valley; Ronald E. Reedy, San Diego, both of Calif.

[73] Assignee: The United States of America as represented by the Secretary of the Navy, Washington, D.C.

[21] Appl. No.: 273,445

[22] Filed: Jul. 5, 1994

Related U.S. Application Data

[63] Continuation-in-part of Ser. No. 171,326, Dec. 21, 1993, abandoned.

[51] Int. Cl.⁶ .................................................. H01L 21/265
[52] U.S. Cl. ................. 437/173; 437/174; 148/DIG. 93; 148/DIG. 94
[58] Field of Search ..................... 437/173, 174; 148/DIG. 93, DIG. 94

[56] References Cited

U.S. PATENT DOCUMENTS

| | | |
|---|---|---|
| 3,811,182 | 5/1974 | Ryan, Sr. et al. . |
| 4,422,091 | 12/1983 | Liu . |
| 4,436,557 | 3/1984 | Wood et al. . |
| 4,545,823 | 10/1985 | Drowley . |
| 4,641,963 | 2/1987 | Levine . |
| 4,656,519 | 4/1987 | Savoye . |
| 4,674,176 | 6/1987 | Tuckerman . |
| 4,716,447 | 12/1987 | Savoye . |
| 4,760,031 | 7/1988 | Janesick . |
| 4,774,557 | 9/1988 | Kosonocky . |
| 4,865,923 | 9/1989 | Ralston et al. . |
| 4,932,747 | 6/1990 | Russell et al. . |
| 4,961,052 | 10/1990 | Tada et al. . |
| 4,975,638 | 12/1990 | Evans et al. . |
| 5,027,063 | 6/1991 | Letourneau . |
| 5,061,643 | 10/1991 | Yagi . |
| 5,354,420 | 10/1994 | Russell ...................................... 156/643 |
| 5,385,633 | 1/1995 | Russrell et al. .......................... 156/693 |

OTHER PUBLICATIONS

P.G. Carey et al., "A Shallow Junction Submicrometer PMOS Process Without High–Temperature Anneals," IEEE Electron Device Letters, vol. 9, No. 10, Oct. 1988, pp. 542–544.

V. Gutman, ed., *Halogen Chemistry*, vol. 2 New York: Academic Press, 1967, pp. 173–189.

H.F. Winters et al, "Surface Processes in Plasma–Assisted Etching Environments", J. Vac. Sci. Tech. B 1(2), Apr.–Jun. 1983.

B. A. Heath et al, "Plasma Processing for VLSI," Chapter 27, *VLSI Handbook*, (San Diego: Academic Press, 1985)pp. 487–502.

R. M. Osgood, Jr. et al, "Localized Laser Etching of Compound Semiconductors in Aqueous Solution", Appl. Phys. Lett., 40, 391, 1982.

(List continued on next page.)

*Primary Examiner*—Robert Kunemund
*Attorney, Agent, or Firm*—Harvey Fendelman; Thomas Glenn Keough; Miachael A. Kagan

[57] ABSTRACT

A method of simultaneously improving the spectral response and dark current characteristics of an image gathering detector is disclosed. The method uses an excimer laser to redistribute and activate ion implanted dopant species in the backside of an image gathering device such as a backside-illuminated CCD. Alternately, the excimer laser is used to incorporate dopants from a gaseous ambient into the backside of the image gathering device and simultaneously redistribute and activate the dopants. The redistribution of the dopant is controlled by the laser pulses and provides for a peak dopant concentration at the back surface of the image gathering device which provides for improved spectral response and simultaneously improves dark current characteristics.

15 Claims, 8 Drawing Sheets

OTHER PUBLICATIONS

R. J. von Gutfeld et al, "Laser–Enhanced Etching in KOH", Appl. Phys. Lett., 40 352 (1982).

F. V. Bunkin, "Laser Control over Electrochemical Processes", SPIE vol. 473 Symposium OPTIKA '84, pp. 31–37.

S. Braunauer et al, "Adsorption of Gases in Multimolecular Layers", J. Am Chem. Soc., 60, 309 (1938).

R. Gauthier et al, "Mechanism Investigations of a Pulsed Laser Light Induced Desorption", Phys. Stat. Sol. (A), 38, 447 (1976).

D. Ehrlich et al, "A Review of Laser–Microchemical Processing", J. Vac. Sci. Tech., B, 1, 969 (1983).

F. A. Houle, "Basic Mechanisms in Laser Etching and Deposition,", Appl. Phys. A, 41, 315 (1986).

D. Bauerle, "Chemical Processing with Lasers: Recent Developments", Appl. Phys. B, 46, 261 (1988).

T. J. Chuang, "Laser–Induced Chemical Etching of Solids: Promises and Challenges", *Laser Controlled Chemical Processing of Surfaces*, vol. 29, pp. 185–194.

R. Kullmer et al, Laser–Induced Chemical Etching of Silicon in Chlorine Atmosphere: I. Pulsed Irradiation, Appl. Phys. A, 43, 227 (1987).

P. Mogyorosi et al, "Laser–Induced Chemical Etching of Silicon in Chlorine Atmosphere: II. Continuous Irradiation", 45, 293.

R. Kullmer et al, "Laser–Induced Chemical Etching of silicon in Chlorine Atmosphere: III. Combined CW and Pulsed Irradiation", 47, 377 (1988).

Y. Horiike et al, "Excimer–Laser Etching on Silicon", Appl. Phys. A, 44, 313 (1987).

W. Sesselmann et al, "Chlorine Surface Interaction and Laser–Induced Surface Etching Reactions", J. Vac. Sci., Tech. B 3, 1507 (1985).

S. Palmer et al "Laser–Induced Etching of Silicon at 248 nm by $F_2$/Ne," Conference on Lasers and Electro–Optics Technical Digest Series 1988, vol. 7, 284 (Optical Society of America, Washington, D.C. 1988).

J. H. Brannon, "Chemical Etching of Silicon by $CO_2$–Laser Induced Dissociation of $NF_3$", Appl. Phys. A, 46, 39 (1988).

T. J. Chuang, "Infrared Laser Radiation Effects On $XeF_2$ Interaction with Silicon", J. Chem. Phys., 74, 1461 (1981).

F. A. Houle, "Photoeffects on the Fluorination of Silicon: I. Influence of Doping on Steady–State Phenomena", J. Chem. Phys., 79, 4237 (1983).

F. A. Houle, "Photoeffects on the Fluorination of Silicon: II. Kinetics of the Initial Response to Light", J. Chem. Phys., 80, 4851, (1984).

T. J. Chuang, "Multiple Photon Excited $SF_6$ Interaction with Silicon Surfaces", J. Chem. Phys., 47, 1453 (1981).

M. D. Armacost et al, "193 nm Excimer Laser–Assisted Etching of Polysilicon", Mat. Res. Soc. Symp. Proc., vol. 76, (1987) pp. 147–156.

C. Tassin et al, "Thinned Backside Illuminated CCDs for Ultraviolet Imaging", SPIE vol. 932 Ultraviolet Tech. II(1988).

S. D. Russell et al, "Bipolar Transistors In Silicon–On–Sapphire (SOS): Effects of Nanosecond Thermal Processing", IEEE SOS/SOI Tech. Conf. Proc. (1990).

K. H. Weiner et al, "Thin–Base Bipolar Transistor Fabrication Using Gas Immersion Laser Doping", IEEE 1989.

Wolf & Tauber Silicon Processing for the VLSI ERD, vol. 1, Process Tech. Lattice Press, Sunset Beach, CA (1986) pp. 308–309.

S. D. Russell et al, "Excimer Laser–Assisted Etching of Silicon Using Chloropentafluoroethane", *In–Situ Patterning: Selective Area Deposition and Etching*, Mater. Res. Soc. Proc., 158, 325 (1990).

D. Lubben, "Laser Induced Plasmas for Primary Ion Deposition of Epitaxial Ge and Si Films", J. Vac. Sci. Tech., B, 3, 968 (1985).

John R. Abelson et al, "Epitaxial $Ge_xSi_{1-x}$/Si (100) Structures Produced by Pulsed Laser Mixing of Evaporated Ge on Si (100) Substrates", *Appl. Phys. Lett.* 52, 230(1988).

A.E. Bell, "Review and Analysis of Laser Annealing", RCA Review, 40, 295 (1979).

L. D. Hess et al, "Applications of Laser Annealing in IC Fabrication", in *Laser–Solid Interactions and Transient Thermal Processing of Materials*, Mat. Res. Soc. Symp. Proc., 13, 337 (1983).

R. J. Pressley, "Gas Immersion Laser Diffusion (Gilding)", *Laser Processing of Semiconductor Devices*, Proc. SPIE, 385, 30 (1983).

D. H. Lowndes et al, Pulsed Excimer Laser (308 nm) Annealing of Ion Implanted Silicon and Solar Cell Fabrication, *Lase–Solid Interactions and Transient Thermal Processing of Materials*, Mat. Res. Soc. Symp. Proc., 13, 407 (1983).

"Excimer Laser Planarization System", *Solid State Technology* 1989.

T.E. Deacon et al "Automation and Defect Control of Silicon Epitaxy for CCD Devices", *Microelectronics Manufacturing Tech.*, May 1991.

D. J. Ehrlich et al, "Laser–induced microscopic etching of GaAs and InP", *Appl. Phys. Lett.*, 36(8), 15 Apr. 1980.

Brewer, Peter, "Photon–assested dry etching of GaAs", *Appl. Phys. Lett*, 45(4), 15 Aug. 1984.

Y. Rytz–Froidevaux et al, "Laser Generated Microstructures", *Appl. Physl. A*.,37, 121–138, (1985).

G. Kaminsky, "Micromachining of Silicon Mechanical Structures", *J. VacSci. Technol.B*, vol. 3,No. 4 Jul./Aug. 1985.

Industry News, *Semiconductor International* May 1990.

S. D. Russell et al, "Excimer Laser Assisted Etching of Silicon Using Chloropentafluorethane", *Mat.Res. Soc. Symp. Proc.* vol. 158 1990.

Blouke, "800×800 Charged–Coupled Device Image Sensor", *Optical Engineering*, Sep./Oct. 1983/ vol. 22 No. 5.

R. A. Stern et al, "Ultraviolet Quantum Efficiency and Vacuum Stability of Ion–Implanted, Laser Annealed CCDs", SPIE vol. 1071 *Optical Sensors and Electronic Photography* 1989.

R. A. Stern, "Ultraviolet and Extreme Ultraviolet Response of Charge–Coupled Device Detectors", *Optical Engineering*, Sep. 1987/vol. 26, No. 9.

James R. Janesick et al, "Flash Technology for Charge–Coupled–Device Imaging", *Optical Engineering*, Sep. 1987/ vol. 26 No. 9.

METHOD OF IMPROVING THE SPECTRAL RESPONSE AND DARK CURRENT CHARACTERISTICS OF AN IMAGE GATHERING DETECTOR

CROSS REFERENCE TO RELATED APPLICATIONS

This application is a continuation in part of U.S. patent application entitled "Excimer Laser Dopant Activation of Backside-Illuminated CCDs" by D. A. Sexton et al., Ser. No. 08/171,326 now abandoned (Navy Case No. 75,973), filed Dec. 21, 1993 is related to U. S. patent applications entitled "Method of Laser-Assisted Silicon Etching Using Halocarbon Ambients" by S. D. Russell et al., Ser. No. 07/501,707 issued as U.S. Pat. No. 5,385,633 (Navy Case No. 71,978), "Method of Laser-Assisted Etching of III–V and II–VI Semiconductor Compounds Using Chlorofluorocarbon Ambients" by S. D. Russell et al., Ser. No. 07/508,317 issued as U.S. Pat. No. 5,354,320 (Navy Case No. 72,726) and "Laser Texturing" by S. D. Russell et al., Ser. No. 08/212,666 (Navy Case No. 76,069) and hereby incorporates by reference all references therein.

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

A number of image-gathering detectors use charge coupled devices (CCDs) or charge-injection devices (CIDs) with varying degrees of sensitivity and resolution. CCDs and CIDs are solid state electronic imaging devices which read out image charges from wells in an array of pixels. While subtle differences exist between CCDs and CIDs in the device operation, the principle physics of the photo to electrical image detection is the same. CCDs will be described, by way of example, but the teachings herein pertain to any image gathering device that relies on the physics of photo-excited carriers in a semiconductor substrate whose image charges are collected by an array of pixels. CCDs designed for solid-state cameras, such as camcorders, are in great demand and are widely available. They have been designed to provide adequate performance when viewing brightly illuminated scenes. However, in astronomical, scientific and military applications their spectral response, readout noise, dark current, full well-capacity and other characteristics are not satisfactory.

To overcome the limitations of imaging through the polysilicon gates that necessarily cover all of the sensitive pixel array, it would be desirable to illuminate the image gathering device such as a CCD from the backside if the silicon substrate were thin enough. In other words, a solution to obtaining better light sensitivity, would be the thinning of the backside of the CCD to a total thickness of roughly 10 microns and illumination from the backside.

FIG. 1 schematically shows the relevant portions of a typical backside-illuminated CCD array with a semiconductor substrate S, usually silicon. Its thin cross-section S' allows more radiation to reach its detector array D. The thinning technique has been at least partially successful, to improve the spectral response of CCDs. The silicon substrate upon which the array resides is made thin enough to permit short-wavelength light (blue and ultraviolet) to penetrate into the active regions of the device. However, for a backside-illuminated CCD, the electrical characteristics in a shallow region near the back surface dominate the CCD response to short wavelength photons. Silicon develops a thin native oxide (<30 Å thick) that can contain enough trapped positive charge to deplete a region several thousand Angstroms deep into the CCD. The absorption depth for high energy (blue or UV) photons in silicon is very short (about 30 Å for 250 nm light). Therefore, photogenerated electrons created in this region can drift toward the $Si/SiO_2$ interface and become trapped or recombine thereby drastically reducing the quantum efficiency in the UV and blue.

Diffusion of p+ dopants into the back surface and subsequent chemical etching to a buried epitaxial layer has been reported by M. M. Blouke, et al., in "800×800 Charge-Coupled Device Image Sensor", Opt. Eng. 22, 607–614 (1983), to direct signal charge generated near the backside toward the frontside potential wells. Difficulties in controlling the uniformities in diffusion and etching, and obtaining shallow (near surface) dopant concentrations have mitigated the use of this process in manufacturing.

Other techniques to improve the response to short wavelength light depend on the supply of a surplus of negative charge on the back surface to overcome the positive oxide charge and bend the bands upward into accumulation. This will drive signal electrons away from the $Si/SiO_2$ interface on the back surface and toward the collection electrodes. The source of the surplus negative charge has been supplied by flood illumination with UV light ("backside charging") or a thin metal layer on the backside active area ("flash gate") to improve the blue and UV response as described in J. R. Janesick, et al. in "Flash Technology for Charge-Coupled-Device Imaging in the Ultraviolet", Optical Engineering, 26, 852–863 (1987), and U.S. Pat. No. 4,760,031 by Janesick entitled "Producing CCD Imaging Sensor with Flashed Backside Metal Film". The backside charge provided by the UV illumination dissipates, thereby requiring periodic recharging. Furthermore, this method is inherently incompatible with detection of wavelengths below that used for the charging. The flash gate process requires substantial post-thinning processing (60hour oxide growth followed by a 10 Å Pt flash deposition) limiting its desirability in a manufacturing process. Furthermore, these techniques can lead to hysteresis in the quantum efficiency (QE) due to instability of the backside potential and device degradation.

An alternative method of accumulating the backside of the CCD is by ion implantation of the backside and subsequent heating to activate the dopant. Initially, only a fraction of the implanted dopant atoms reside in locations in the crystal lattice which are electrically active. Thermal energy is provided to permit the migration of dopant atoms into active sites. The obstacle that must be overcome by fabricators when this approach is relied on is that the backside doping process (and heating) occurs after all frontside device fabrication. A large temperature elevation of the frontside circuitry at this point in the process can cause deleterious effects. For example, backside doping of a silicon substrate with boron has attempted to enhance the spectral response and suppress the dark current of CCD detectors. Boron implantation is normally followed by a thermal anneal at about 1000° C. for thirty minutes. But temperatures above about 750° C. can cause shifts in transistor threshold and contact resistance values in prior fabrication steps, and temperatures exceeding the aluminum sintering temperature (about 450° C.) damage metal layers in a device. Since the final implant occurs after all frontside device fabrication, the anneal temperature is restricted to 400° C. At this temperature, boron doses of approximately $10^{13}$ ions/cm$^2$ have only 10 to 20% of the dopants activated as reported by H. Ryssel, I. Ruge, *Ion Implantation*, (New York, John Wiley & Sons, 1986), page 248 and shown in FIG. 2. As the implant dosage increases, the silicon crystal becomes more damaged and the percentage activation decreases. The consequence is that frequency response is affected and dark current can rise to objectionable levels.

Prior attempts at laser annealing ion implanted dopants of CCDs has been reported by Tassin et al. in "Thinned Backside Illuminated CCDs for Ultraviolet Imaging", SPIE, Vol. 932, *Ultraviolet Technology II*, 305–310 (1988) and by Stern et al., in "Ultraviolet and Extreme Ultraviolet Response of Charge-Coupled-Device Detectors", Optical Engineering, 26, 875–883 (1987), using CW argon-ion (488 nm) and pulsed frequency-doubled Nd:YAG (530 nm) lasers respectively. Tassin et al. and Stern et al., however, are not effective at fabricating very shallow active regions, or the required dopant distribution with peak concentration at the surface, nor a uniform distribution of dopants across the pixel array. Furthermore, both of these prior art laser processes rely on subsequent photolithographic masking, chemical etching, and subsequent mask removal to provide the desired dopant profile with peak concentration at the back surface. In comparison, the herein disclosed and claimed invention provides a desired dopant profile with peak concentration at the back surface in a single maskless laser processing step.

C. Tassin, et al. reported in their presentation at OPTO '88 in Paris, France (17–19 May 1988) and their paper identified above, of the use of a scanning laser beam to perform backside annealing of ion implanted dopant to improve the blue response of backside illuminated CCDs. They report on boron implantation followed by the use of continuous wave (CW) illumination by an argon ion laser with subsequent chemical removal of part of the implant profile containing the maximum of the dopant distribution. The processes of the report and paper are in contrast to several features of the disclosed and claimed invention herein which provides for significant improvements thereover, namely: (1) The disclosed and claimed invention herein uses photoincorporation of a doping ambient (such as boron trifluoride) which is superior to the ion implantation technique of C. Tassin, et al. for creating very shallow junctions and improved short wavelength (blue, UV, x-ray) response; (2) The disclosed and claimed invention herein uses pulsed laser activation using an excimer laser that allows for nonlinear dynamics which can provide for supersaturated doping concentrations beyond the solid solubility limit which can improve responsivity and provide for a stable "pinned-QE condition" eliminating QE hysteresis; (3) The disclosed and claimed invention herein uses excimer laser activation with short UV wavelengths allows for very shallow p+ layer providing improved detection performance at UV and shorter wavelengths due in part to the shallow junction and due to the corresponding higher dopant concentration, (4) The disclosed and claimed invention herein provides for a uniform doping concentration thereby eliminating the extra processing steps involved in complex masking and chemical etching and handling thin membranes to remove part of their laser processed material; (5) The disclosed and claimed invention herein uses a stationary beam and does not use the beam scanning technique of the Tassin et al. article that produces scan lines in the recrystallized silicon which are detrimental to spatial uniformity. The disclosed and claimed invention herein is an improvement to the Tassin et al. process that allows a tailoring of laser energy for profile customization to eliminate the additional steps for etching in addition to the other advantages of simultaneous dark current improvements and defective pixel repair as discussed below. R. A. Stern et al.'s "Ultraviolet and Extreme Ultraviolet Response of Charge-Coupled-Device Detectors", Optical Engineering, 26, 875–883 (1987) describes laser annealed backside illuminated CCDs. Stern et al. disclose an ion implantation of BF$_2$, and pulsed laser annealing using a frequency-doubled Nd:YAG laser (at 530 nm). Although the pulsed laser technique used by Stern et al. here is an improvement over that used by Tassin et al. for the reasons described above. Stern et al.'s choice of a long laser wavelength prevents the one step creation of the desired doping profile as provided by the disclosed and claimed invention herein. There is substantial difference in absorption depth between Stern et al.'s wavelength of 540 nm and the use of 248 nm in the disclosed and claimed invention herein (excimer wavelengths of typically between 150 nm to 351 nm are useable, although shorter wavelengths could be used in accordance with this inventive concept). The shorter wavelength of the disclosed and claimed invention herein provides shallower penetration depth, lower energy requirements to melt the silicon, higher dopant concentrations and the subsequent improved responsivity as compared to Stern et al. The higher dopant concentrations provided by the disclosed and claimed invention herein provides for the QE-pinned condition required to eliminate QE hysteresis. As a consequence, substantial savings in processing steps are provided by the disclosed and claimed invention herein, improvements in the process are provided by the disclosed and claimed invention herein as compared to their process, and added benefits of simultaneous pixel repair and improved dark current are provided by the disclosed and claimed invention herein that are not disclosed in Stern et al. Page 877, section 2.2, paragraph 3 of Stern et al. discusses further processing (etching the annealed, thin backside membrane) to reestablish the high implant gradient at the back surface. This is again the consequence of the longer wavelength used by Stern et al., and adds to the complexity described above for Tassin et al. which is compounded by the requirement that etching must be performed on thin (roughly 10 microns) of silicon. The extra steps involved in chemically etching the CCDs after laser activation significantly increases not only direct fabrication costs due to extra steps, but also the costs associated with yield losses of devices that have substantial investment of nearly complete fabrication prior to processing of the backside.

The R. A. Stern et al. article entitled "Ultraviolet Quantum Efficiency and Vacuum Stability of Ion Implanted, Laser Annealed CCDs" in SPIE, Vol. 1071, *Optical Sensors and Electronic Photography*, 1989, pp. 43–57 further describe attempts at laser annealing CCDs. Stern et al. teach that for excimer laser annealed devices "the absolute UV quantum efficiencies of these devices were significantly lower than either the unimplanted CCD . . . or the Nd:glass annealed CCDs" (page 53, lines 7–8) thereby teaching away the use of excimer lasers for laser annealing CCDs. Also on page 53, section 4.4, lines 2–4, Stern et al. teach "re-etching is desirable to remove a small . . . region at the back surface of the CCD which, after standard implantation processing, produces an E-field of the opposite direction from that desired." This is again in contradiction to the herein claimed invention which eliminates this requirement and will be described in the ensuing specification. Stern et al. is not effective at fabricating very shallow active regions, or the required dopant distribution with peak concentration at the surface, nor a uniform distribution of dopants across the pixel array. Furthermore, the described preferred process of stern et al. relies on subsequent etching to provide the desired dopant profile with peak concentration at the back surface. In comparison, the herein disclosed and claimed invention provides a desired dopant profile with peak concentration at the back surface in a single maskless laser processing step.

High performance low light detecting CCDs are also concerned with dark current, i.e. the thermally generated charge carriers under zero illumination. Excessive dark current will destroy the dynamic range of the imager thereby masking low light level signals. In addition, variations across the array will degrade image quality and can be misinterpreted by subsequent signal processing circuitry. Dark current effects in CCDs range from individual pixels with excessive dark current to high average dark current and variations in dark current across the imaging array. While dark current is normally associated with front side circuitry, crystalline damage arising from unannealed implanted dopants can lead to generation sites for dark current. Therefore, in accordance with the disclosed and claimed invention herein, it is highly desirable to provide fabrication techniques as provided for by the disclosed and claimed invention to improve both the spectral response and dark current of CCDs.

Stern et al. disclose on page 877, section 2.3, paragraph 2 that "Device characteristics such as . . . dark current . . . did not appear to differ significantly between untreated and ion-implanted devices". This is reiterated in their discussion on page 882, section 4 that ". . . device parameters such as dark current and readout noise, which are associated with the frontside circuitry, do not appear to be affected by the implant and laser anneal processing". To the contrary, in accordance with the disclosed and claimed invention herein, a method is set forth whereby electrical activation is superior to that of conventional anneals such that a decrease in the standard deviation of the average dark current is obtained and in some cases a decrease is obtained in average dark current in the laser processed array. Furthermore, pixels that have dark current defects are repaired by the disclosed and claimed invention herein as described hereafter. Not only are these significant improvements over the prior art, but they are unrecognized as possible effects since it was believed backside laser processing would not affect device parameters associated with the frontside circuitry as stated above. FIG. 4, page 878 of the Stern et al. reference shows a two dimensional image of their CCD readout, note the "numerous hole-like low signal areas". They "suggest that they are permanent imperfections in the thinned CCD"; however, defective pixels such as these have been repaired by the disclosed and claimed invention herein.

U.S. Pat. No. 4,422,091 by Liu entitled "Backside Illuminated Imaging Charge Coupled Device", U.S. Pat. No. 4,716,447 by Savoye entitled "Interrupting Charge Integration in Semiconductor Imagers Exposed to Radiant Energy", and U.S. Pat. No. 4,641,963 by Levine entitled "Back-Illuminated CCD Imager Adapted for Contrast Transfer Function Measurements Thereon" are examples of state-of-the-art backside illuminated CCDs that are not designed for low dark current with defect free pixels, enhanced blue response nor is there a method to achieve these properties as described by the disclosed and claimed invention herein. U.S. Pat. No. 4,774,557 by Kosonocky entitled "Back-Illuminated Semiconductor Imager with Charge Transfer Devices in Front Surface Well Structure", and U.S. Pat. No. 4,760,031 by Janesick entitled "Producing CCD Imaging Sensor with Flashed Backside Metal Film" are examples of CCDs that use a thin metal layer on the backside active area to improve the blue and UV response. These are representative of a alternative method for achieving enhanced responsivity to short wavelengths but are distinct from the disclosed and claimed invention herein to achieve enhancement. The fabrication process used in Kosonocky and Janesick are not applicable for repairing defective pixels and improving dark current as the disclosed and claimed invention herein. U.S. Pat. No. 4,656,519 by Savoye entitled "Back-Illuminated CCD Imagers of Interline Transfer Type" describes a method to reduce charge transfer smear in CCD imagers using deep highly doped implant regions near the CCD registers. The CCD described by Savoye uses a diffused p+ dopant on the backside layer to help forestall surface recombination of photogenerated charge carriers. Such a processing method can not achieve the shallow junctions desired for optimal performance at short wavelengths in accordance with the disclosed and claimed invention herein, nor repair defected pixels or improve dark current in accordance with the disclosed and claimed invention herein since only low temperature diffusions and anneals can be employed without damage to the remaining device.

U.S. Pat. No. 4,436,557 by Wood et al. entitled "Modified Laser-Annealing Process for Improving the Quality of Electrical P-N Junctions and Devices", is representative of the prior art of using a laser to form p-n junctions. Wood teaches a process of irradiating a semiconductor substrate having a doped layer while the semiconductor substrate is at an elevated temperature to form a p-n electrical junction and of providing the resulting body with electrical contacts. The formed structure is for the conversion of a flux of solar radiation to electrical power and the problems associated with herein described image gathering devices (spectral response and dark current characteristics) of the disclosed and claimed invention herein aren't recognized. Furthermore, the teachings of Wood et al. only pertain to the formation of an electrical p-n junction. This is contrary to the disclosed and claimed invention herein that creates a dopant profile with a peak concentration at the surface, without forming a p-n junction and to provide for improved spectral response and dark current characteristics in an image gathering device.

The article by A. E. Bell entitled "Review and Analysis of Laser Annealing", RCA Review, 40, 295–338 (1979) provides background information on laser annealing and reviews early results on laser activation of dopant. The articles by K. H. Weiner et al., "Thin-Base Bipolar Transistor Fabrication Using Gas Immersion Laser Doping", IEEE Electron Dev. Lett., 10, 260–263 (1989) and S. D. Russell et al., "Bipolar Transistors in Silicon-On-Sapphire (SOS): Effects of Nanosecond Thermal Processing" in IEEE SOS/SOI Technology Conference Proceedings (1990) are representative of applications of laser processing in the fabrication of electronic devices. Weiner et al. and Russell et al. are concerned with fabricating the base and emitter regions of narrow base bipolar transistors. For that reason Weiner et al. calls for "by using multiple pulses dopants can be distributed evenly throughout the melted layer to form box-like profiles." Box like profiles of the type taught by Weiner et al. and Russell et al. are not desired for improving of the spectral responses and dark current characteristics in comparison to the disclosed and claimed invention which does improve of the spectral responses and dark current characteristics. Furthermore, Weiner et al. and Russell et al. pertain to forming p-n or n-p semiconductor junctions, not the desired dopant profile with peak concentration at the surface in comparison to the disclosed and claimed invention which does provide a desired dopant profile with peak concentration at the surface.

It should be noted that laser processing to activate dopant either after ion implantation or through a laser-assisted decomposition from the gas phase has been long known in the field. Additional references have been reported on yearly since 1980 by the Materials Research Society Conferences. In view of that, the disclosed and claimed invention provides noted improvements to the prior art with a simple technique that combines several different advantages and an unexpected new results (that of improving dark current and repairing defective pixels) as will become more apparent in view of the disclosed and claimed invention herein.

Thus, in view of the deficiencies of the art and in accordance with the teachings of this inventive concept, an improvement is provided in the blue response in CCD imagers; an improvement is provided in processing techniques in semiconductor fabrication that lead to major cost savings, yield and reliability improvements due to the large volume production and repetitive nature of processing by the eliminating of one or more steps from a process flow since each step eliminated has an associated yield, for example, substantial fabrication costs savings and time reduction in the backside processing of CCDs; an improvement is provided in the repair of defected pixels; an improvement is provided, in addition to improving dark current, in the forming a QE-pinned condition and enhancing blue response simultaneously in one process using an excimer laser annealing process in accordance with the teachings of this inventive concept.

SUMMARY OF THE INVENTION

The present invention is directed to providing a low-temperature laser process (below the aluminum sintering temperature of about 450° C.) to simultaneously improve the spectral response and dark current characteristics in an image gathering device. Activation and redistribution of ion implanted dopants or activation and redistribution of dopants incorporated from a gaseous ambient is performed, or effected, by rapid melting and recrystallization of a thin layer on the backside of an image gathering device. The method prescribed results in a dopant distribution (profile) with a peak at the back surface thereby providing for improved spectral response and pinning of the backside potential to eliminate QE hysteresis. Simultaneously, defective pixels are repaired and the dark current characteristics are improved by the rapid annealing.

An object of the invention is to provide for the laser activation and redistribution of the ion implanted dopant on the backside of a thinned image gathering device such as a CCD, CID or other image gathering device.

Another object of the invention is to provide for the laser incorporation, activation and redistribution of the dopant on the backside of a thinned image gathering device such as a CCD, CID or other image gathering device.

Another object is to provide a low-temperature laser activation and redistribution of ion implanted dopants on the backside of a thinned image gathering device such as a CCD, CID or other image gathering device.

Yet another object is to provide a low-temperature laser incorporation, activation and redistribution of dopants on the backside of a thinned image gathering device such as a CCD, CID or other image gathering device.

Another object is to provide for the QE-pinned condition to eliminate QE hysteresis in an image gathering detector.

Another object is to provide a method for improving dark current characteristics of an image gathering device such as a CCD, CID or other image gathering device.

Another object is to provide a method for improving the spectral response of an image gathering device such as a CCD, CID or other image gathering device.

Yet another object is to provide a method for the repair of defective pixels in an image gathering device such as a CCD, CID or other image gathering device.

Still another object is to provide a method for the simultaneous improvement of the spectral response and dark current characteristics of an image gathering device such as a CCD, CID or other image gathering device.

Another object is to provide a method allowing the redistribution and activation of dopants without subjecting the entire substrate to elevated temperatures.

Still another object is to provide a method permitting formation of a very high surface concentration, shallow dopant profile on an image gathering device such as a CCD, CID or other image gathering device without the need for subsequent chemical processing.

Still another is to provide a method allowing the option of working with wafers, chips or package devices.

Still another object is to provide a method that allows the prepackaging of devices prior to laser treatment so that the fragile die are protected and can be thoroughly tested.

A further object is to provide a method which allows only devices which are successfully packaged and tested for illumination and activation.

Another object of the invention is to provide a low temperature laser process for photo incorporation of dopant from a gaseous ambient and simultaneous activation on the backside of an image gathering device such as a CCD, CID or other image gathering device.

These and other objects of the invention will become more readily apparent from the ensuing specification when taken in conjunction with the appended drawings.

BRIEF DESCRIPTION OF THE DRAWINGS

The file of this patent contains at least one drawing executed in color. Copies of this patent with color drawings will be provided by the Patent and Trademark Office upon request and payment of the necessary fee.

DESCRIPTION OF THE PREFERRED EMBODIMENT

Figure 1:
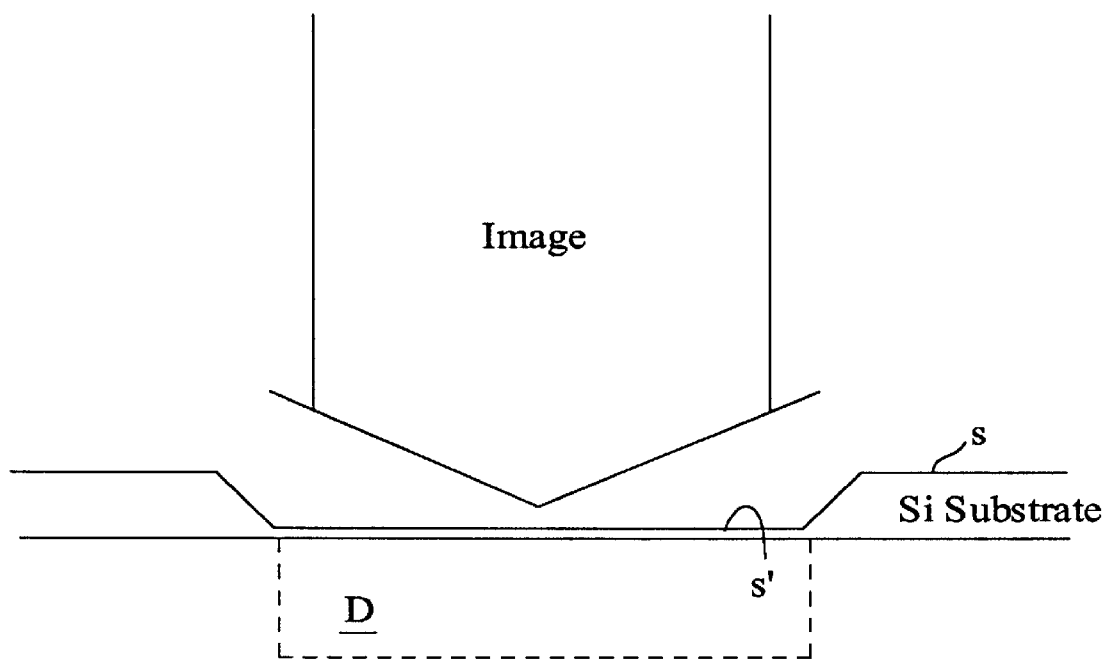
FIG. 1 is a cross-sectional schematic depiction of a backside-illuminated CCD array.
Figure 2:
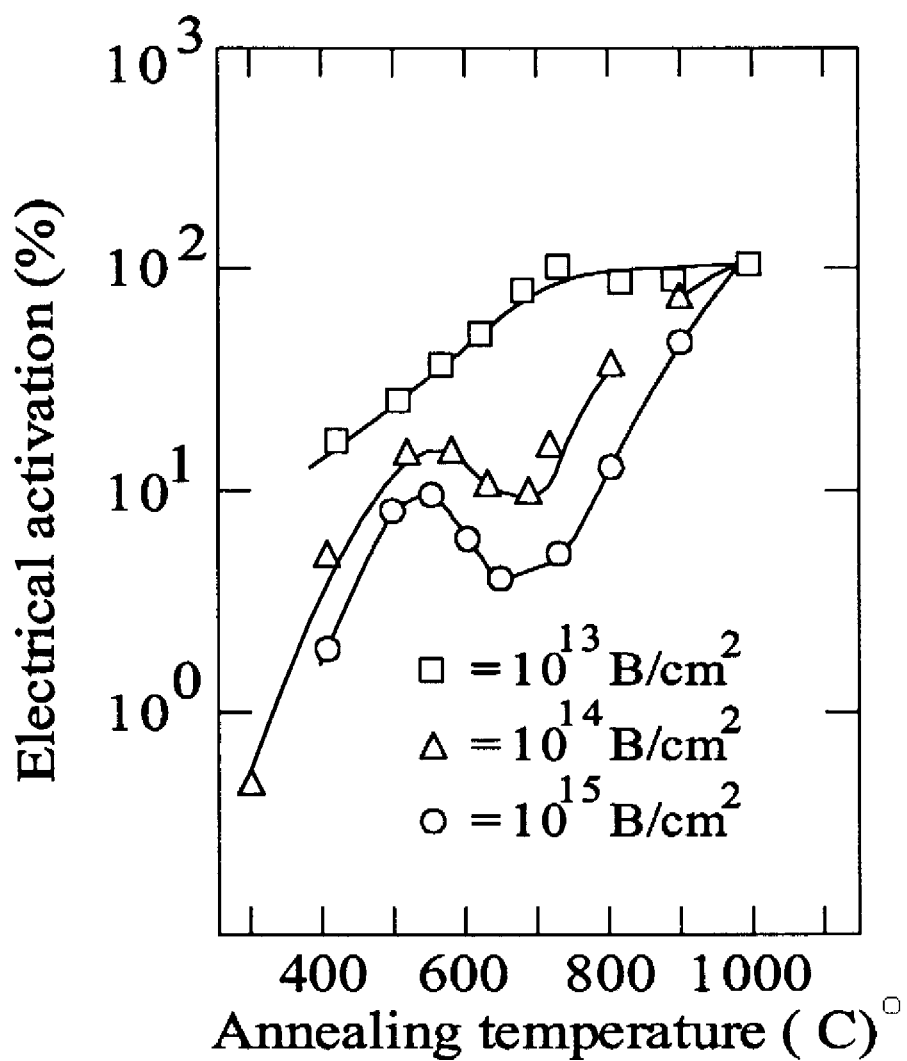
FIG. 2 shows the relative increase in electrical activation as a function of annealing temperature for boron implant doses of $10^{13}$ ions/cm$^2$, $10^{14}$ ions/cm$^2$ and $10^{15}$ ions/cm$^2$.

CCDs and CIDs are solid state electronic imaging devices which read out image charges from wells in an array of pixels. While subtle differences exist between CCDs and CIDs in the device operation, the principle physics of the photo to electrical image detection is the same. CCDs will be described, by way of example, but the teachings herein pertain to any image gathering device that relies on the physics of photo-excited carriers in a semiconductor substrate whose image charges are collected by an array of pixels. The present invention is directed to providing a low-temperature laser process (below the aluminum sintering temperature of about 450° C.) to simultaneously improve the spectral response and dark current characteristics in an image gathering device. The process disclosed and claimed herein can be accomplished at substrate temperatures well below the aluminum sintering temperature, and are generally carried out at room temperature of about 23° C. The method calls for providing a uniformly distributed, spatially homogenized intensity profile of short wavelength energy pulses from an excimer laser to cover the image gathering area on the semiconductor substrate of the image gathering device. The image gathering area, in the sense of a CCD or CID, is the pixel array. Activation and redistribution of ion implanted dopant or activation and redistribution of dopant incorporated from a gaseous ambient are performed, or effected, by rapid melting and recrystallization of a thin layer on the backside of an image gathering device. The method prescribed results in a dopant distribution (profile) with a peak at the back surface thereby providing for improved spectral response. The high peak dopant concentration at the back surface pins the electrical potential providing for the quantum efficiency (QE) pinned condition. This eliminates QE hysteresis in image gathering devices. Simultaneously, defective pixels are repaired and the dark current characteristics are improved by the rapid annealing.

In other words, a method is disclosed herein for simultaneously improving the spectral response and dark current characteristics of an image gathering device by first ion implanting dopants of a predetermined species, dose and energy into the image gathering area in a semiconductor substrate of the image gathering device. Then, short wavelength energy pulses are provided from an excimer laser with a uniformly distributed spatially homogenized intensity profile of sufficient proportions to cover at least a portion of the image gathering area in the semiconductor substrate of the image gathering device. Then, by illuminating the portion of the image gathering area in the semiconductor substrate of the image gathering device with at least one of the spatially homogenized short wavelength energy pulses with sufficient fluence to uniformly melt the portion of the image gathering area in the semiconductor substrate, the ion implanted dopants are redistributed and activated during the uniform recrystallizing thereby creating a dopant gradient having a peak active dopant concentration at a back surface of the image gathering device without creating an electrical junction in that portion of the image gathering area in the semiconductor substrate of the image gathering device.

The herein disclosed method further teaches placing the semiconductor substrate of the image gathering device in a processing chamber, evacuating the processing chamber and purging the processing chamber with a nonreacting ambient prior to the step of illuminating. Repeating the illuminating of at least one other portion of the image gathering area in the semiconductor substrate of the image gathering device with at least one spatially homogenized short wavelength energy pulse uniformly melts the other portions that may be contiguously abutting and effects a redistributing, uniform recrystallizing and activating of the ion implanted dopants in the image gathering area. This method can be carried out while maintaining the semiconductor substrate of the image gathering device at a temperature below 450° C. The semiconductor substrate is composed of elements selected from the group of the periodic table group IV semiconductors, group III–V semiconductors and group II–VI semiconductors, for example silicon. The ion implanted dopant species may be boron ions or boron difluoride with an energy below 100 keV at a dose is in the range $1 \times 10^{13}$ cm$^{-2}$ to $1 \times 10^{16}$ cm$^{-2}$. The method further calls for limiting the temperature of the processing by limiting the duration of the uniform melting of the semiconductor substrate to be in the range 25 nsec to 225 nsec. This disclosed process is applicable to image gathering devices such as CCDs, CIDs, or other image gathering devices having an array of pixels. This method provides a peak dopant concentration at a back surface of the image gathering device providing a quantum efficiency (QE) pinned condition. Further details of this process will be described in the following specification.

The herein described and claimed processes also eliminate the requirement of subsequent patterning, etching, and mask removal steps to achieve the peak dopant concentration at the back surface of the image gathering device. This is accomplished by the synergistic combination of ion implantation parameters, gaseous ambient conditions and laser processing conditions claimed herein. In the case of ion implanted dopants, the preferred technique implants high doses of shallow boron or boron difluoride (BF$_2$) ions into the bare back surface of the image gathering area of the detector. This is contrary to standard practices which cap, for example, a silicon surface with silicon dioxide to prevent out-diffusion of dopants for high implant doses. An oxide cap must be removed prior to excimer laser annealing otherwise cracking and/or ablating of the oxide will degrade the device performance. The use of an oxide cap adds additional complexity which increases processing costs and yield losses and are preferably eliminated from the ion implantation portion of the process. Eliminating the oxide cap does not decrease the amount of active dopant at the back surface of the CCD or imaging device since the herein described laser processing conditions provide for full activation of the ion implanted dopants and appropriate redistribution of the dopants to form the peak concentration of active dopants at the back surface.

Figure 3:
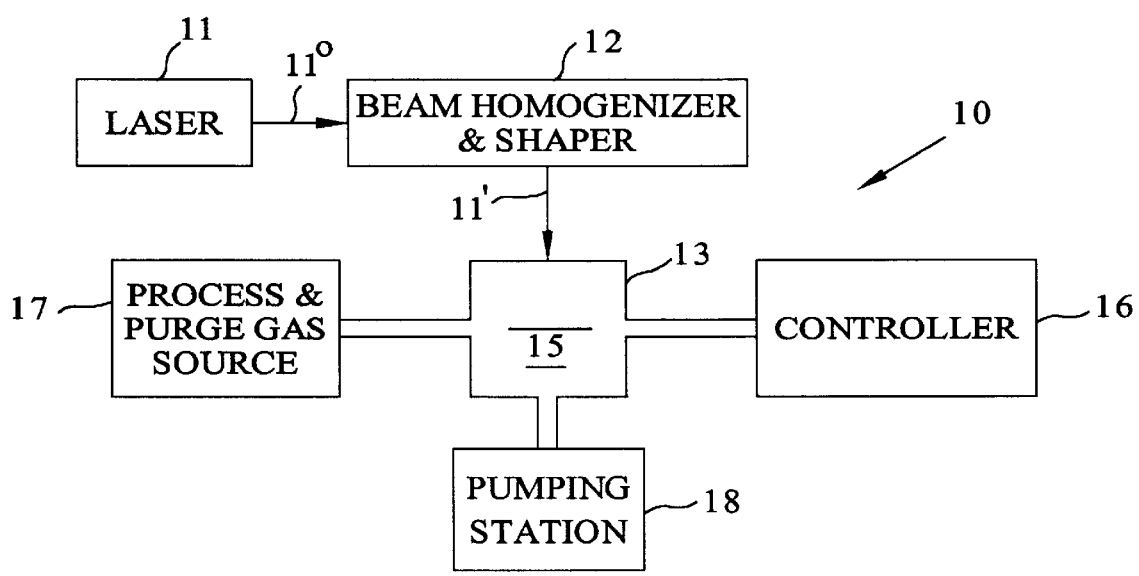
FIG. 3 schematically shows the processing setup used in accordance with this inventive concept.

Referring now to FIG. 3 of the drawings, a processor 10 assures an activation of dopant ions implanted in a semiconductor substrate and/or the doping of a semiconductor substrate in an appropriate gaseous ambient in a manner which will improve the semiconductor imaging devices' spectral response and dark current characteristics. A typical semiconductor substrate could be, but not limited to silicon, GaAs and other compound semiconductors etc. and may be configured like that portrayed in FIG. 1 which has a substrate S with a thinned portion S'. The semiconductor substrate may be in wafer or chip form, or may be a fully fabricated image gathering device such as a CCD, CID or other image gathering device.

Processor 10 includes an excimer laser 11 that emits its output beam 11° into a beam homogenizer and shaper 12 which assures that an appropriately homogenized and shaped beam 11' is directed into a processing chamber 13 and onto a sample 15 for processing. The homogenizer and shaper, such as that disclosed by Stephen D. Russell et al. in U.S. Pat. No. 4,932,747, homogenizes or uniformly distributes the spatial intensity profile of beam 11 to have a substantially flat response across an area that covers sample 15. A gas mass flow controller system 16 controls the flow and pressurization of processing and purging gases from a process and purge gas source 17 in processing chamber 13 so that the processing of the sample can be accomplished in accordance with the method disclosed hereinafter. A pumping station 18 is coupled to the processing chamber to remove by-products of the processing. A full description of these constituents for effecting the activation of ion implanted dopants, or doping in a gaseous ambient, are elaborated on in the above referenced co-pending inventions and will make readily apparent an appreciation of the salient features of this inventive concept to those skilled in the art. These details are incorporated herein by reference. The need has become apparent for improved dark current characteristics and spectral response for CCD imagers. The device physics dictates that high concentrations of $p^+$ dopants be used to prevent the trapping of photogenerated charges near the back surface of the CCD to be employed. Since this fact is well-known to those involved in this field of technology, a number of processing techniques have been investigated in order to implement the expected responsivity improvements. The improvement of this inventive concept optimizes the processing steps and techniques which are intimately tied to device processing yield, reliability, cost and viability. This improved method provides for activation by excimer laser 11 of ion implanted dopants in the backside of a CCD array sample 15 and/or doping by excimer laser 11 of the backside of a CCD array sample 15 in a gaseous ambient. The laser more fully and uniformly activates the dopants resulting in the simultaneous significant reduction in the number of dark current defects, and improvement in dark current. Simultaneously, the laser redistributes the dopants to have a dopant depth profile with a peak concentration at the surface for enhanced spectral response. Laser annealing in accordance with the processing technique of this inventive concept does not create excessive heat in the rest of a substrate and, therefore, is not prevented from making a more complete annealing. It is not subject to the same processing limitation mentioned in the Background of the Invention with respect to boron, because the laser processing technique of this inventive concept induces dramatic temperature rises only during a time duration of typically tens of nanoseconds (25 nsec to 225 nsec) and the temperature rises are contained within a thin region on the back of sample 15. Precise control of the dopant profile and dopant distribution can be obtained by varying key process parameters, including repeated illumination with pulses. Processing parameters along with typical values are given in Table I:

TABLE I

| PROCESS PARAMETER | TYPICAL VALUE | APPROX. VARIATIONS |
|---|---|---|
| implant dose | $5 \times 10^{15}$ ions/cm$^2$ | $1 \times 10^{13}$–$1 \times 10^{16}$ ions/cm$^2$ |
| implant species | boron difluoride | B, BF$_2$, or GILD |
| implant energy | 25 keV | <100 keV |
| implant depth | <100 nm | 5–150 nm |
| furnace anneal | none | ≦450° C., 30 min |
| process ambient | helium | inert or GILD ambient |
| substrate temperature | 23° C. | below 450° C. |
| laser fluence | 1.0 J/cm$^2$ | 0.7–2.0 J/cm$^2$ |
| melt duration | ~75 nsec | 25–225 nsec |
| laser wavelength | 248 nm | 157–351 nm |
| laser intensity profile | tophat, 10% uniformity | same |
| laser temporal profile | 23 ns | 20–100 ns |
| number of laser pulses | 10 | 1–10 |
| ambient pressure | 500 Torr | 1 milliTorr–1000 Torr |

Figure 4:
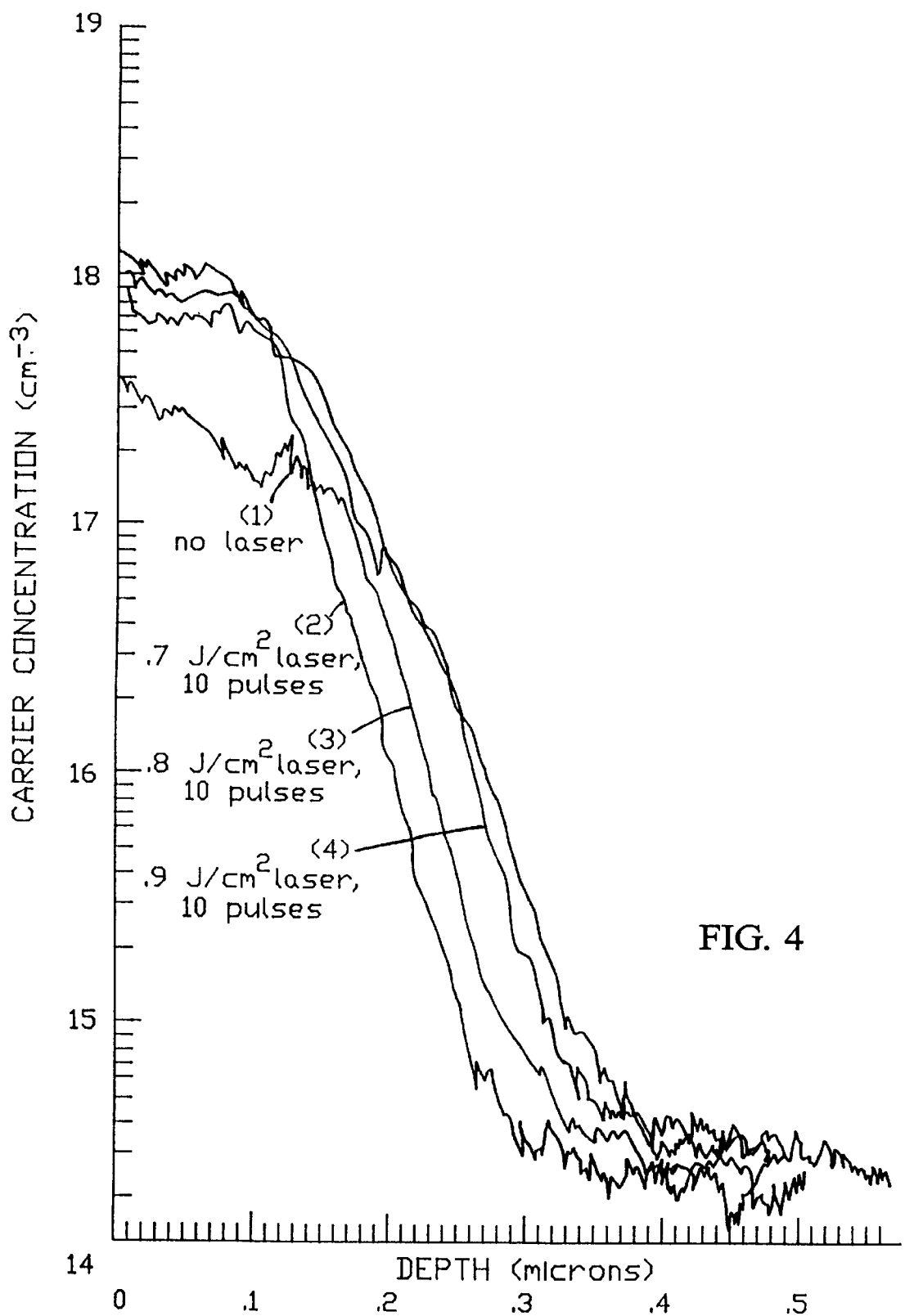
FIG. 4 depicts carrier concentration profiles for four samples which were all treated in the manner set forth in Table 1, with the exception of laser fluence.

FIG. 4 shows the electrically active charge carrier profiles of concentration versus depth obtained using the spreading resistance profiling technique for four individual samples which were all treated in the manner listed in Table 1, except for variations in laser fluence. The samples were silicon samples which are identical to those used in the fabrication of CCD arrays. An epitaxial layer had been implanted in each sample with $10^{13}$ ions/cm$^2$ and was annealed at 400° C. The samples were then placed in chamber 13 and illuminated by a beam 11' with a range of fluences and number of pulses using excimer laser 11 operating at 248 nm. Sample #1 was regarded as a control sample and received no laser pulses whatsoever. Samples #2, #3 and #4 were irradiated with laser fluences of 0.7, 0.8 and 0.9 J/cm$^2$, respectively. Sample #1 which has no laser activation showed approximately 10 to 20% boron activation while the laser activated samples #2, #3 and #4 exhibit approximately 100% activation. The other samples, samples #2 through #4, also indicate that profiles may be controlled by changes in laser fluence since the depth of active dopant distribution increases with laser pulse energy. The concentrations shown in FIG. 4 indicate that laser annealing results in an increase in the level of boron activation from about 20% to approximately 100%.

As indicated in FIG. 4, typical melt depths and the corresponding thin processed layer are on the order of 0.1 to 0.5 microns due to the shallow absorption depth of the UV wavelengths of the excimer laser (approximately 100 Å in silicon), and are a function of the laser fluence, including number of pulses, and optical, thermal properties of the sample. The preferred embodiment uses a heavier implant species, for example BF$_2$, implanted at a lower energy (about 20 to 30 keV) than that shown in FIG. 4 to optimize the performance and responsivity of the imaging device. This would allow the laser to fully control the dopant profile without excess implant straggle. Therefore the laser, not the implant, would be the dominant controlling process in the dopant profile and would be used to redistribute the dopants to obtain the peak dopant concentration at the back surface of the image gathering device. Alternately, improvement can be further obtained by laser incorporation of the dopant from the gas phase to be described later. The one step laser processes provide for the desired dopant profile distribution with a peak concentration at the back surface. Increases in implant dose will also allow a greater laser activated dopant concentration than shown in FIG. 4. The higher concentration is desired for the QE-pinned condition, vide supra.

CCD test devices were fabricated to examine the effects referred to above on actual devices and fully reduce to practice a fully functional improved image gathering device. CCDs subsequently identified as numbers 1, 2, 3 and 4 were examined under various laser conditions to examine part functionality and performance before and after laser treatment in accordance with this inventive concept. Samples which had failed dark current tests (i.e. exhibited dark current in excess of desired values) were stripped of their anti-reflective coating and retested. The samples were then appropriately illuminated and retested. Results are given in Table II and indicate a significant reduction in the number of defects observed in the POST as compared to the PRE laser treated samples. The terms "low", "total", and "fatal" are herein used to describe dark current densities greater than the mean array dark current by five, ten, and fifty nanoamps, respectively. Specifications as to the magnitude, number of allowed, and location of these dark current defects within a CCD array will vary for the particular application.

TABLE II

| SAMPLE # | LOW DEFECT | TOTAL DEFECT | FATAL DEFECT | AVE DARK CURRENT | SAD DEV CURRENT | LASER ENERGY |
|---|---|---|---|---|---|---|
| #1 PRE | 13 | 14 | 5 | 8.5 | 3.11 | 0 |
| #1 POST | 4 | 3 | 1 | 8.8 | 0.83 | 1.1 |
| #2 PRE | 39 | 16 | 2 | 8.6 | 1.52 | 0 |
| #2 POST | 31 | 19 | 1 | 8.1 | 1.41 | 0 |
| #3 PRE | 20 | 4 | 0 | 9.4 | 0.68 | 0 |
| #3 POST | 1 | 0 | 0 | 9.5 | 0.41 | 0.8 |
| #4 PRE | 66 | 46 | 14 | 10.0 | 5.07 | 0 |
| #4 POST | 1 | 1 | 0 | 9.6 | 0.47 | 0.3 |

Detailed data analysis shows the average dark current of the samples varies with testing (note the control sample #2). However, there was a noticeable decrease in the standard deviation of the average dark current and a reduction in the total number of defects. Referral to Table III indicates that not only the number but the magnitude of the pixel defects was reduced.

TABLE III

LASER ANNEAL EVALUATION OF DARK CURRENT

Dark current mean of 8100 pixels:

| Pre-laser: | 9.95793 | Post-laser: | 9.657816 |
|---|---|---|---|

Dark current mean of 7052 pixels:

| Rows | 3 to 88 | Columns | 5 to 86 |
|---|---|---|---|
| Pre-laser: | 9.969242 | Post-laser: | 9.594448 |

Standard Deviation:

| Prelaser Overall: | 4.826055 | Checked | 5.126414 |
|---|---|---|---|
| Postlaser Overall: | .8119957 | Checked | .4537418 |

Failure distribution (nA)

|  | low | total | fatal |
|---|---|---|---|
| prelaser | 66 | 46 | 14 |
| postlaser | 1 | 1 | 0 |

*** Mean + 5 nA range Prelaser Failures ***

| PIXEL | PRE | POST |
|---|---|---|
| 8 14 | 15.9755 | 10.58907 |
| 9 51 | 18.24071 | 10.68361 |
| 10 13 | 18.06182 | 10.39991 |
| 12 57 | 16.89952 | 10.14779 |
| 13 9 | 15.4112 | 10.49445 |
| 15 5 | 17.10811 | 10.5575 |
| 17 61 | 15.55824 | 9.89566 |
| 18 63 | 15.49861 | 9.70659 |
| 22 21 | 16.48217 | 9.35992 |
| 25 67 | 15.46875 | 9.92714 |
| 26 22 | 16.4524 | 9.58048 |
| 27 66 | 15.76691 | 9.80112 |
| 32 21 | 15.31979 | 9.35992 |
| 36 13 | 15.31979 | 9.42298 |
| 36 15 | 15.43906 | 9.67502 |
| 39 9 | 15.88609 | 9.23382 |
| 39 11 | 16.66099 | 9.35992 |
| 40 60 | 17.61478 | 9.42298 |
| 42 9 | 16.95907 | 9.48603 |
| 42 63 | 15.20053 | 9.29695 |
| 43 62 | 19.93954 | 9.51743 |
| 45 8 | 18.71753 | 10.17936 |
| 47 68 | 15.82646 | 9.48603 |
| 47 69 | 16.24381 | 9.42298 |
| 49 5 | 17.61478 | 9.73807 |
| 50 63 | 19.25406 | 9.45446 |
| 50 71 | 17.37633 | 9.80112 |

TABLE III-continued

LASER ANNEAL EVALUATION OF DARK CURRENT

| 52 70 | 16.72062 | 9.42298 |
|---|---|---|
| 53 5 | 15.43906 | 10.17927 |
| 56 67 | 15.76683 | 10.08473 |
| 61 69 | 16.03505 | 9.80112 |
| 64 5 | 19.55214 | 10.21084 |
| 66 6 | 16.4524 | 10.08473 |
| 66 66 | 18.15123 | 9.07631 |
| 66 67 | 18.68775 | 9.45446 |
| 68 65 | 18.00227 | 9.1078 |
| 68 66 | 15.43898 | 9.39141 |
| 69 64 | 18.83671 | 9.26539 |
| 70 62 | 15.28994 | 9.29687 |
| 71 62 | 15.43898 | 9.48603 |
| 71 63 | 15.52846 | 9.58048 |
| 74 10 | 15.52838 | 9.86418 |
| 75 9 | 15.4092 | 10.1163 |
| 75 60 | 16.63121 | 9.42298 |
| 76 49 | 18.3599 | 9.6751 |
| 77 9 | 15.05149 | 10.27381 |
| 77 54 | 16.03513 | 9.51751 |
| 77 56 | 18.89643 | 9.83261 |
| 77 58 | 16.48217 | 9.45446 |
| 78 55 | 1S.31979 | 9.39141 |
| 78 63 | 19.76073 | 9.45455 |
| 79 11 | 15.58802 | 10.30538 |
| 79 12 | 16.21387 | 9.89575 |
| 79 13 | 17.28692 | 9.73807 |
| 79 55 | 18.00227 | 9.39141 |
| 80 52 | 17.01862 | 9.26539 |
| 81 13 | 15.4092 | 10.33695 |
| 83 18 | 15.46883 | 10.39991 |
| 84 43 | 16.78025 | 9.32844 |
| 84 50 | 15.14098 | 9.95863 |
| 84 51 | 15.05157 | 9.32844 |
| 85 20 | 16.98884 | 9.83261 |
| 85 23 | 16.42254 | 9.73807 |
| 85 29 | 15.31979 | 9.73807 |
| 85 33 | 16.03505 | 9.58048 |
| 86 25 | 15.05149 | 9.70659 |

*** Mean + 10 nA range Prelaser Failures ***

| PIXEL | PRE | POST |
|---|---|---|
| 10 52 | 25.93043 | 10.36835 |
| 13 12 | 21.72786 | 10.11622 |
| 15 7 | 20.89325 | 10.68361 |
| 19 62 | 23.93344 | 9.89566 |
| 20 62 | 22.92002 | 9.67502 |
| 25 66 | 27.62925 | 9.73807 |
| 26 23 | 22.20475 | 9.54908 |
| 26 66 | 21.54904 | 9.35992 |
| 28 68 | 24.32093 | 9.89566 |
| 29 56 | 22.71142 | 9.9902 |
| 31 22 | 28.434 | 9.48594 |
| 34 17 | 24.73819 | 9.26539 |
| 40 11 | 20.68466 | 9.549 |
| 40 72 | 23.27773 | 9.64362 |
| 41 9 | 25.3939 | 9.86418 |

TABLE III-continued

LASER ANNEAL EVALUATION OF DARK CURRENT

| | | |
|---|---|---|
| 43 8 | 39.1936 | 9.58057 |
| 43 9 | 25.60257 | 9.9902 |
| 52 75 | 49.20807 | 9.39141 |
| 57 70 | 22.68165 | 9.45455 |
| 60 69 | 23.51618 | 9.83269 |
| 66 5 | 21.37023 | 10.14787 |
| 69 63 | 21.34045 | 9.07631 |
| 70 64 | 41.48867 | 9.39141 |
| 72 64 | 26.43702 | 9.2339 |
| 73 65 | 26.37747 | 9.58057 |
| 75 8 | 41.90593 | 10.1163 |
| 76 9 | 29.53675 | 10.17927 |
| 76 58 | 23.09891 | 9.549 |
| 76 60 | 20.35689 | 9.58057 |
| 78 56 | 24.88715 | 9.29695 |
| 78 58 | 21.81727 | 9.67502 |
| 79 58 | 25.69198 | 9.45446 |
| 80 12 | 22.38357 | 10.14779 |
| 80 13 | 34.63348 | 9.76956 |
| 81 52 | 46.34686 | 9.42298 |
| 81 53 | 39.28309 | 9.26539 |
| 82 13 | 22.89032 | 10.27381 |
| 82 15 | 29.03008 | 10.36835 |
| 83 16 | 26.2582 | 9.92714 |
| 83 19 | 38.80611 | 10.17927 |
| 83 47 | 44.49892 | 9.20233 |
| 83 48 | 46.73427 | 9.64353 |
| 84 41 | 21.51919 | 9.58057 |
| 84 49 | 23.09891 | 9.83269 |
| 85 24 | 21.34037 | 9.92714 |
| 85 50 | 22.08557 | 10.02177 |

*** 50 and greater nA range Prelaser Failures ***

| PIXEL | PRE | POST |
|---|---|---|
| 19 63 | 50.37046 | 10.14779 |
| 49 71 | 170.0973 | 11.25083 |
| 76 8 | 50.37053 | 10.21084 |
| 76 54 | 147.2667 | 13.74045 |
| 81 15 | 201.7204 | 11.12473 |
| 82 49 | 64.82595 | 10.87268 |
| 82 50 | 156.9235 | 19.6653 |
| 82 51 | 112.9014 | 12.25926 |
| 83 46 | 52.36744 | 9.58057 |
| 83 49 | 60.08693 | 10.62047 |
| 83 50 | 113.0505 | 14.9696 |
| 83 51 | 119.7268 | 13.8035 |
| 84 46 | 75.46635 | 9.48594 |
| 85 43 | 107..2087 | 9.89575 |

*** Mean + 5 nA Postlaser Failures **

| PIXEL | PRE | POST |
|---|---|---|
| 83 50 | 113.0505 | 14.9696 |

** Mean + 10 nA Postlaser Failures **

| PIXEL | PRE | POST |
|---|---|---|
| 82 50 | 156.9235 | 19.6653 |

A die which had marginally failed dark current specifications has been made a functional die with this laser annealing technique. See sample 3-PRE as compared to the same sample as 3-POST in Table II. Repairs of marginal or defective pixels in an otherwise marginal sample are made with the process of this inventive concept. In other words, the laser annealing of the backside implant results in defect reductions.

Figure 5:
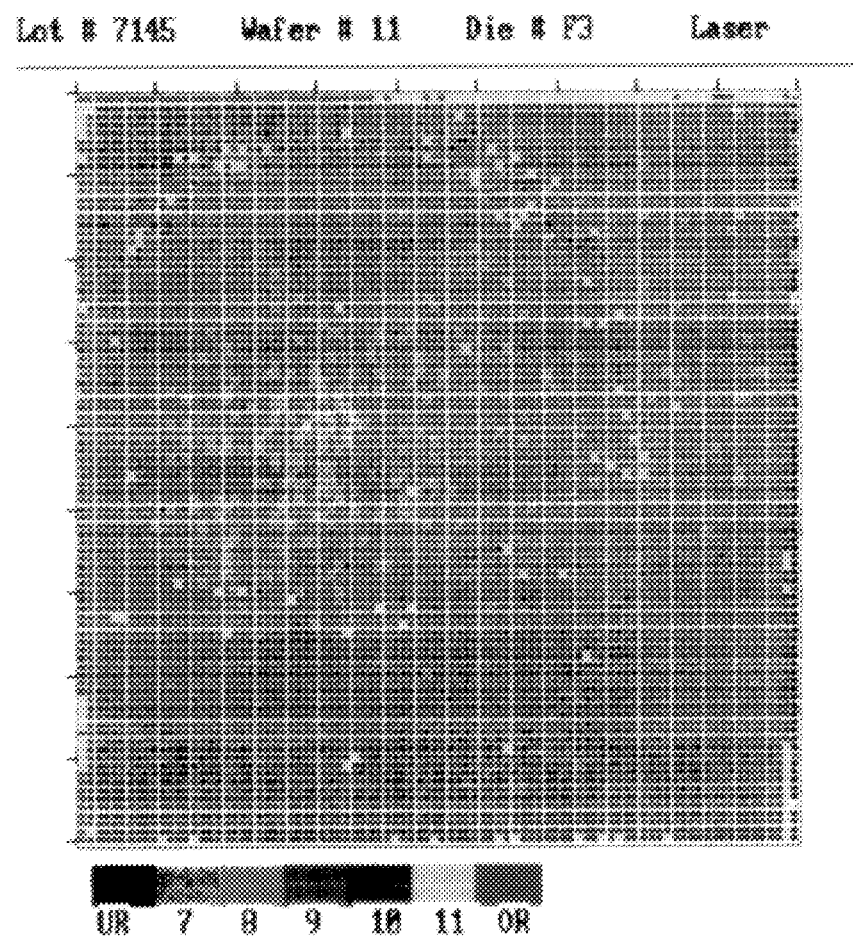
FIG. 5 represents pixels of a CCD in need of the laser annealing in accordance with this inventive concept.
Figure 6:
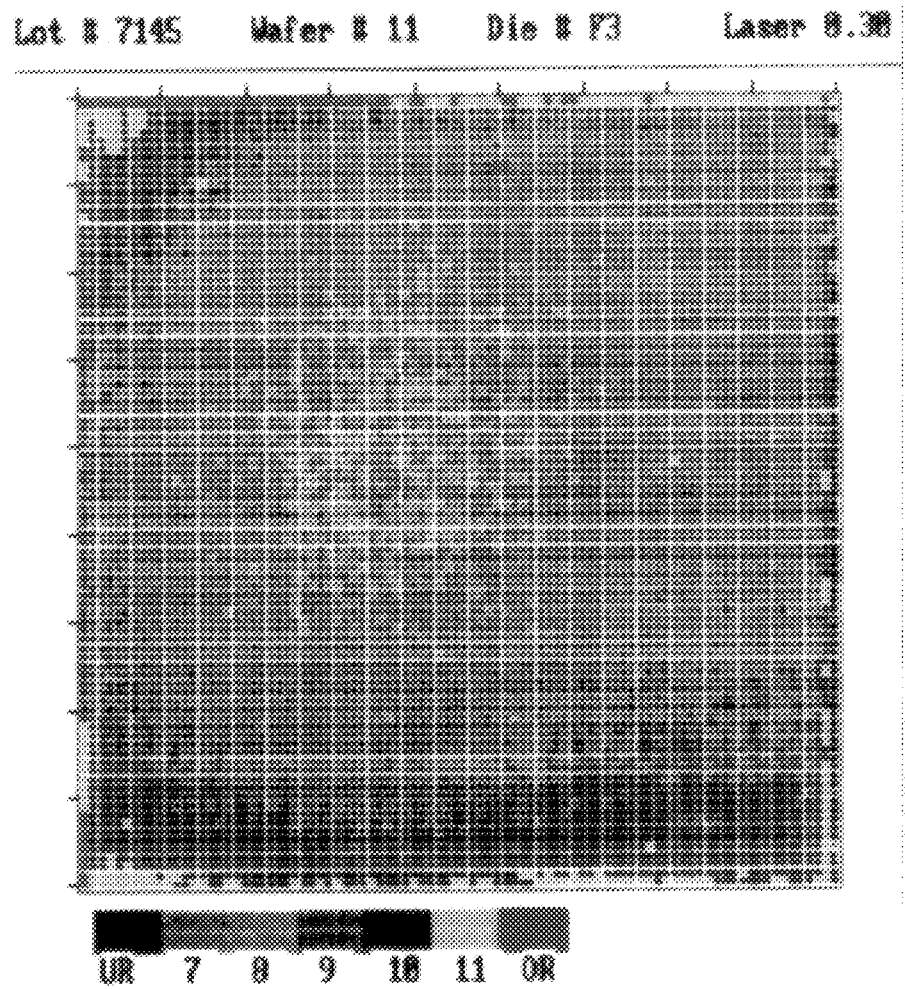
FIG. 6 represents pixels of a CCD following the laser annealing in accordance with this inventive concept.
Figure 7:
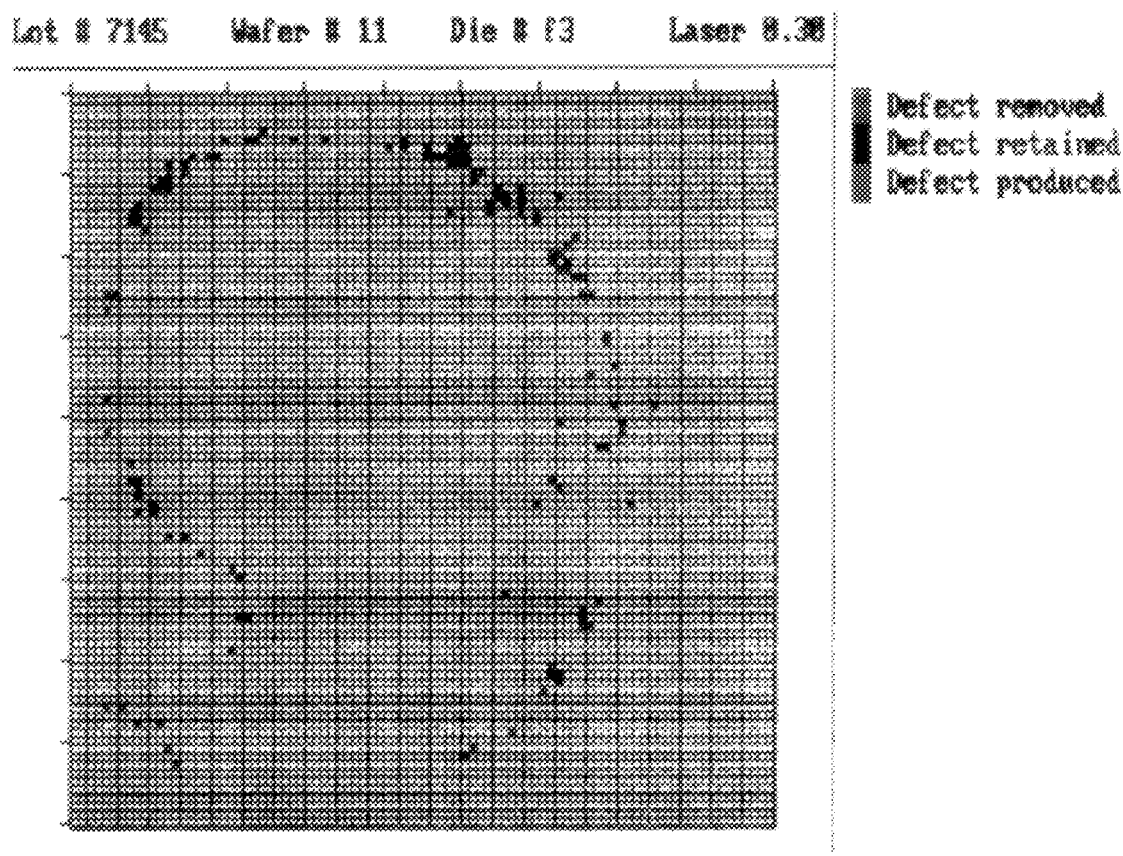
FIG. 7 shows the pixels of a CCD in which the defects have been removed in accordance with this inventive concept.

Referring to FIGS. 5, 6 and 7, and the tabulated data of Tables II and III, graphic proof of the capability of this invention is demonstrated. These FIGS. and Tables show that this invention repairs and makes serviceable a typical (not best case) laser annealed sample of a 90 by 90 pixel CCD array. The inventive process disclosed herein is not, however, limited to devices of this size but may be modified by one skilled in the art to accommodate any sized array. In fact, a significant advantage of the herein disclosed and claimed invention is that the teachings refer to the simultaneous uniform processing of the entire pixel array of the image gathering detector thereby providing for further salient advantages in spectral and dark current uniformity across the entire device. This technique is also valid for extremely large arrays, i.e. those that exceed the size of the spatially homogenized laser beam. A step, illuminate and repeat procedure is a repetition of the illumination with pulses of energy on different regions of the image gathering device. This procedure may be used if the regions are illuminated by pulses having a uniform distribution of sufficient energy to melt the semiconductor and the regions have borders in contact with each other. This does not cause scan lines in the recrystallized silicon or discontinuities in the device responsivity and their corresponding device degradation.

FIG. 5 shows a map of the dark current for a 90×90 pixel CCD array prior to laser processing. Numerous defective pixels, with dark currents exceeding 11 nA/cm$^2$ are present and are represented as a red pixels in the figure. The particular array portrayed, #3, was chosen due to the unique spiral defect structure which was "repaired" by laser illumination.

FIG. 6 shows the dark current map following the laser process. Note that all defective pixels were improved, i.e. the representative red pixels are removed. FIG. 7 identifies the defective pixels that were removed by the disclosed process. The mean dark current of the 8100 pixels in the array decreased from 9.958 nA/cm$^2$ to 9.658 nA/cm$^2$. The standard deviation of the dark current, which is representative of the uniformity in the array, decreased from 4.826 nA/cm$^2$ to 0.812 nA/cm$^2$. Furthermore, individual pixels with excessive dark current, attributed to generation at crystalline defects were eliminated or reduced. It will be noted that all defective pixels were improved, most to within acceptable limits. Also, the mean dark current and standard deviation were decreased. As mentioned before, FIGS. 5, 6 and 7 are printouts of dark current for pre-laser annealing (#3 PRE, FIG. 5), post-laser annealing (#3POST in FIG. 6) and the net effect (difference between FIG. 5 and FIG. 6) in FIG.7. The short wavelength of the beam emitted by the excimer laser is absorbed in thin layer (on the order of 10 nm) allowing very shallow anneals and recrystallizations to be performed. The depth of the recrystallizations and/or anneals is related to the laser fluence and pulse duration. Note that laser pulses of the same energy can have different effects on the semiconductor being illuminated. This is due to the variability of the pulse width of the laser which will correspondingly change the peak energy and peak energy density. Lasers emitting wavelengths of light which have much larger penetration depths (longer wavelengths) or much longer pulse widths cannot produce as shallow an activated or redistributed dopant profile with the peak concentration at the surface.

Figure 8:
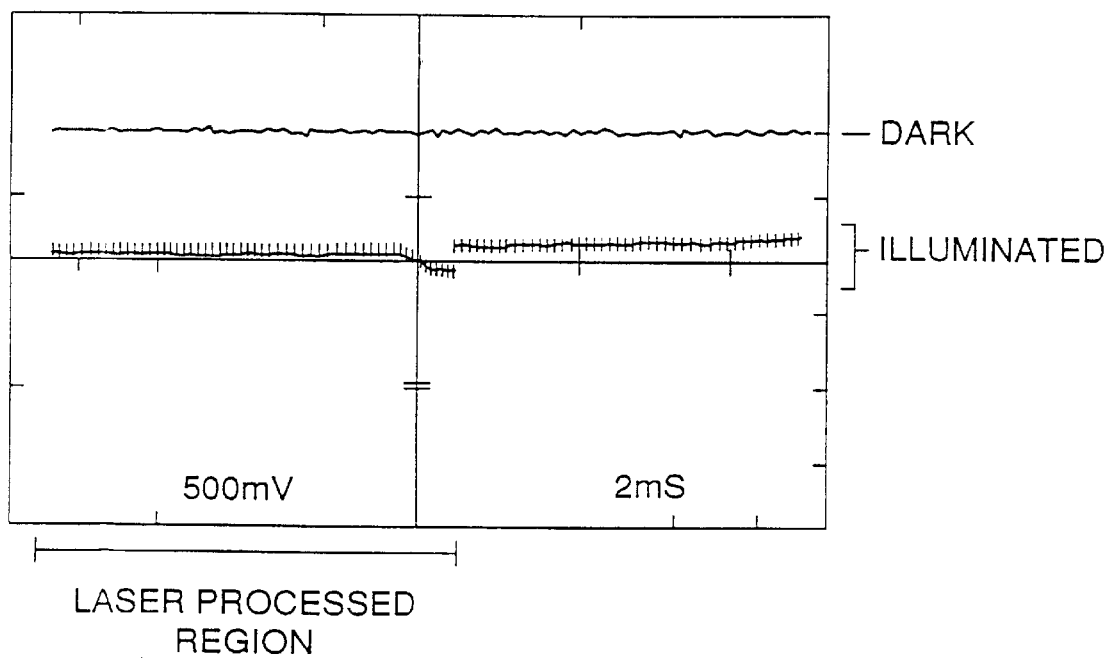
FIG. 8 shows the spectral response line scan from a representative CCD.

It must be noted that with the prescribed inventive process responsivity improvements occur in two areas. First is the uniformity of the responsivity, which becomes more uniform across the array and is a product of the uniform illumination and subsequent uniform recrystallization of the backside of the CCD. All samples show an improvement in response uniformity originally degraded by the spatial non-uniformities in the implant. Secondly, the response of the CCD to blue and shorter wavelengths of light is obtained by providing for a peak dopant concentration at the back surface to allow for the photons absorbed near the back surface to be collected by the pixel electrodes as described in the background. Tests were performed to detect the observed improvement in responsivity with the laser process. Test CCDs were laser annealed on one half of the array. The devices were subsequently flood illuminated with blue light (450 nm) and a line scan across the device measured. This flood illuminating could be with one or more pulses if desired to produce the desired results. FIG. 8 shows the spectral response line scan from a representative CCD. Note that on the half of the CCD which received laser processing (the left hand side in FIG. 8), the response to the blue light improved over that half which received no laser processing. The 20% increase demonstrated here is not optimized, but is representative of the improvement obtained using this technique. Additional improvements can be obtained using the in-situ laser doping process described below or a more shallow implant as described above to increase the peak dopant concentration at the surface.

An alternative method for improving the spectral response and dark current in an image gathering device employs the application of gas immersion laser doping (GILD) as reported in the above referenced work of Weiner et al. and the herein disclosed teachings for processing the image gathering areas. The GILD technique has been applied in the fabrication of semiconductor devices but not in the manner envisaged herein. The process would entail, through modifications to the prior art, the use of a doping ambient such as boron trifluoride, arsine, or other ambients possessing doping constituents which may be suitably incorporated into the sample by this process by one skilled in the art in chamber 13. Ambient dopant is adsorbed onto the sample substrate and upon melting is incorporated into the crystal lattice of the backside of the illuminated device. The dopant concentration and profile obtained would be a function of the number of laser pulses delivered, i. e. repeating the illumination, as a case may call for, in the presence of the dopant gas, the energy of the pulses, the percentage coverage of the dopant gas on the sample substrate, doping ambient pressure or partial pressure, etc. The optimum doping profile for blue response enhancement has the peak dopant concentration at the back surface of the image gathering device as discussed in the Background of the Invention. Note, blue response enhancement refers to increased sensitivity of the image gathering device to blue, ultraviolet (UV), x-ray or higher energy photons. The increased blue response in addition to the overall improvement in uniformity and performance across the pixel array is characterized as the improved spectral response. This profile could be obtained by simply reducing the laser energy during the course of the dopant incorporation process resulting in shorter melt durations and causing shallower regions to have higher dopant concentrations. Further possible benefits of the gas phase doping approach are the elimination of ion implantation crystal damage, elimination of the ion implantation step and of the related device handling, as well as the possibility of obtaining much higher doping concentrations without the crystal damage normally associated with them. This is important to achieve the QE-pinned condition at the back surface of the image gathering detector.

In other words, in this embodiment a method is disclosed for simultaneously improving the spectral response and dark current characteristics of an image gathering device in at least one semiconductor substrate by placing the semiconductor substrate of the image gathering device in a processing chamber, and filling the processing chamber with a doping ambient to a pressure. The pressure of a pure doping ambient or an ambient containing a partial pressure of the doping ambient is normally in the range 1 milliTorr to 1000 Torr, i.e. from under partial vacuum to above atmospheric pressure, as desired to achieve the desired surface coverage of dopant and resulting dopant dose. Short wavelength energy pulses are provided from an excimer laser which are uniformly distributed in a spatially homogenized intensity profile. Each pulse is of sufficient proportions to cover at least a portion of the image gathering area in the semiconductor substrate of the image gathering device. Illuminating the portion of the image gathering area in the semiconductor substrate of the image gathering device with at least one of the spatially homogenized short wavelength energy pulses having sufficient fluence to effect a uniform melting of the portion of the image gathering area in the semiconductor substrate thereby incorporates dopants from the doping ambient into the portion of the image gathering area on the semiconductor substrate of the image gathering device. The illuminating and the uniform melting, causes a uniform redistributing of the incorporated dopants and uniform activating of the incorporated dopants in the image gathering area in the semiconductor substrate and creates a dopant gradient having a peak dopant concentration at a back surface of the portion of the image gathering device without creating an electrical junction in the image gathering area in the semiconductor substrate of the image gathering device thereby providing improvement in the spectral response and the dark current characteristics.

The method also can call for evacuating the processing chamber of the doping ambient and purging the processing chamber with a nonreacting ambient after the steps of incorporating, redistributing and activating. Then reilluminating the portion of the image gathering area in the semiconductor substrate of the image gathering device with at least one of the spatially homogenized short wavelength energy pulses further effects the redistributing and activating of incorporated dopants. The method can further include repeating the step of illuminating on at least one other portion of the image gathering area in the semiconductor substrate of the image gathering device with at least one of the spatially homogenized short wavelength energy pulses. Each other portion is located to provide for a contiguously abutment of portions of uniform melting to effect a uniform melting, redistributing, recrystallizing and activating of the incorporated dopants in the image gathering area.

The method calls for maintaining the semiconductor substrate of the image gathering device at a temperature below 450° C. The material of the semiconductor substrate sample can be composed of silicon, or other elements selected from the group of the periodic table group IV semiconductors, group III–V semiconductors or group II–VI semiconductors. The doping ambient is typically boron trifluoride for this application, but may be readily modified as appropriate to achieve the desired dopant incorporation. The method is appropriate for image gathering devices such as a charge coupled device (CCD), a charge injection device (CID) or any image gathering device whose image gathering area is an array of pixels. The method results in a peak dopant concentration at a back surface of the image gathering device providing a quantum efficiency (QE) pinned condition.

An additional advantage of the herein disclosed and claimed invention is the inherent compatibility with the co-pending laser etching applications cited above. Laser etching immediately followed by control of the dopant profile using the laser as disclosed and claimed herein can be achieved without removing the sample from the processing chamber. This provides for minimal handling, and a reduction of process steps which provides for higher fabrication yield, lower fabrication costs and improved reliability.

The laser activation of the dopant or the laser in-situ dopant incorporation and activation provides a high concentration at the back surface of the backside-illuminated CCD. While the dopant profile will aid in the enhancement of the blue response as described earlier, the high peak surface concentration also allows sufficient accumulation for near 100% detection of photogenerated signal carriers. This pinning of the surface potential, i.e the "QE-pinned condition" improves and stabilizes the quantum efficiency of the device and prevents quantum efficiency (QE) hysteresis. This laser technique for achieving accumulation is also stable with respect to temperature variations unlike temporary surface charging methods of accumulation which are discussed in the Background.

The herein claimed invention is also amenable with advanced techniques in image gathering detector fabrication using lumigens or similar backside deposition treatments to detect or improve detection of specific wavelength regions. This is due to the improved stability of the backside potential by the claimed laser process.

Obviously, many modifications and variations of the present invention are possible in the light of the above teachings. It is therefore to be understood that within the scope of the appended claims, the invention may be practiced otherwise than as specifically described.

We claim:

1. A method for improving the spectral response and dark current characteristics of an image gathering detector, comprising the steps of:
   ion implanting dopants through an image detecting surface of a semiconducting structure to form an ion implanted region;
   generating a spatially homogenized laser beam;
   irradiating said ion implanted region with said homogenized laser beam to melt said ion implanted region; and
   solidifying said ion implanted region whereupon said ion implanted region has a peak dopant concentration substantially at said image detecting surface.

2. The method of claim 1 further includes placing said semiconducting structure in an environment having a temperature less than 450° C.

3. The method of claim 1 wherein said laser beam has a wavelength in the range of 157–351 nanometers.

4. The method of claim 1 wherein said dopants are selected from the group comprising boron difluoride and boron.

5. The method of claim 1 wherein said ion implanted region has a thickness in the range of 5 to 150 nanometers.

6. The method of claim 1 wherein said dopants are ion implanted at a dosage in the range of $1\times10^{13}$ to $1\times10^{16}$ ions/cm$^2$.

7. The method of claim 1 wherein said dopants are ion implanted at an implant energy which is less than 100 KeV.

8. The method of claim 1 wherein said image detecting area is irradiated with pulsed energy at a fluence in the range of 0.7 to 2.0 J/cm2.

9. The method of claim 8, wherein said pulsed energy has a pulse period in the range of 2 to 100 nanoseconds.

10. The method of claim 1 wherein said laser beam comprises a series of optical energy pulses.

11. The method of claim 1 wherein said semiconductor includes material selected from Group IV, Group III–V and Group II–VI of the Periodic Table of Elements.

12. A method of improving the spectral response and dark current characteristics of an image gathering detector, comprising the steps of:
    exposing a surface of an image detecting region of a semiconducting image detector to a doping gas while simultaneously irradiating said surface with a homogenized laser beam to melt said image detecting region; and
    solidifying said image detecting region to form a dopant incorporated region in said image detector so that said dopant incorporated region has a peak dopant concentration substantially at said surface.

13. The method of claim 12 further including the step subjecting said semiconducting image detector to an environment having a temperature of less than 450° C.

14. The method of claim 12 wherein said laser beam has a wavelength in the range of 157–351 nanometers.

15. The method of claim 12 further including the steps of:
    irradiating said surface with a homogenized laser beam to melt said dopant incorporated region; and
    solidifying said dopant incorporated region to redistribute said dopant concentration in said dopant incorporated region.

* * * * *